(12) United States Patent
Satoyoshi et al.

(10) Patent No.: US 6,331,754 B1
(45) Date of Patent: Dec. 18, 2001

(54) INDUCTIVELY-COUPLED-PLASMA-PROCESSING APPARATUS

(75) Inventors: Tsutomu Satoyoshi, Nirasaki; Kenji Amano, Nakakoma-gun; Hiromichi Ito, Kofu; Yoshito Miyazaki, Tokyo, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/565,540

(22) Filed: May 5, 2000

(30) Foreign Application Priority Data

May 13, 1999 (JP) .................................. 11-132618
May 13, 1999 (JP) .................................. 11-132619
May 13, 1999 (JP) .................................. 11-132620

(51) Int. Cl.[7] ...................................... H01J 7/24
(52) U.S. Cl. .................................. 315/111.51; 118/723 I
(58) Field of Search ................ 315/111.51, 111.21; 118/723 I, 723 IR, 723 AN; 156/345

(56) References Cited

U.S. PATENT DOCUMENTS 5,589,737  12/1996  Barnes et al. .
5,716,451   2/1998  Hama et al. .
5,824,605 * 10/1998  Chen et al. ..................... 438/729
5,835,333 * 11/1998  Castro et al. .................. 361/234

FOREIGN PATENT DOCUMENTS 8-195296  7/1996  (JP) .

* cited by examiner

*Primary Examiner*—Don Wong
*Assistant Examiner*—Ephrem Alemu
(74) *Attorney, Agent, or Firm*—Oblon, Spivak, McClelland, Maier & Neustadt, P.C.

(57) ABSTRACT

An inductively-coupled-plasma-processing apparatus includes a main vessel which is partitioned into an antenna chamber and a process chamber by a partition structure. The antenna chamber includes an RF antenna and the process chamber includes a susceptor on which an LCD glass substrate is placed. The partition structure has a dielectric panel constituted of four segments supported by a cross-shaped supporting bracket. The supporting bracket is suspended from the ceiling of the main vessel by a plurality of suspenders. The supporting bracket is used as a case of a showerhead for supplying a process gas into the process chamber.

33 Claims, 13 Drawing Sheets

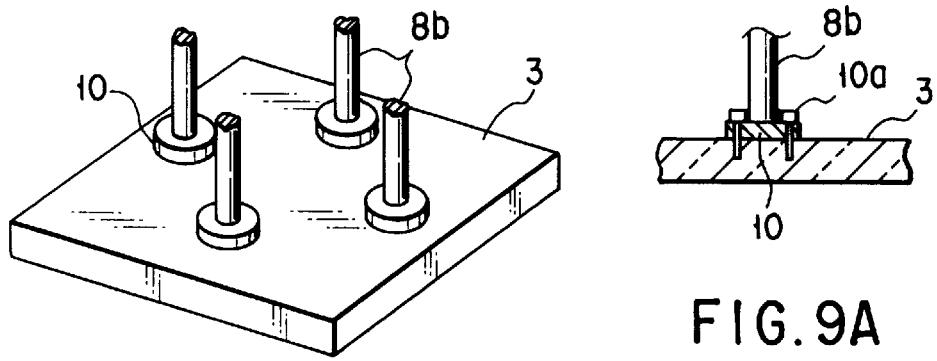
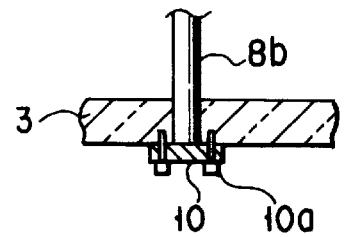
FIG. 8
FIG. 9A
FIG. 9B
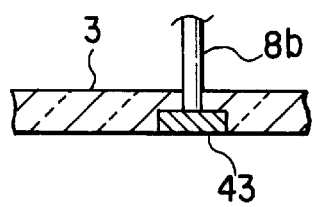
FIG. 11A
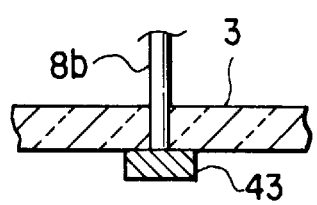
FIG. 11B
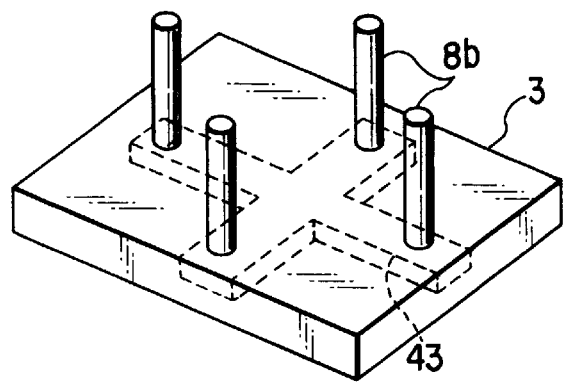
FIG. 10

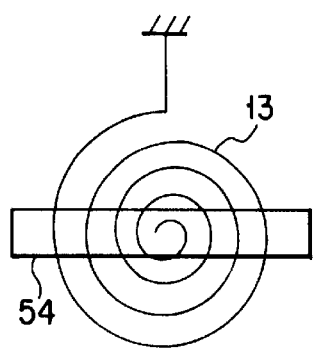
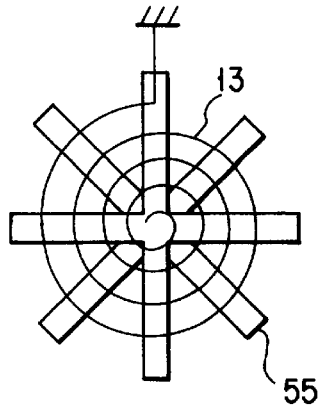
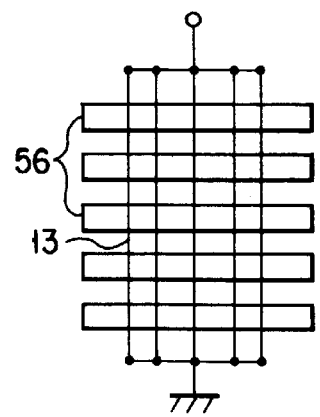
FIG. 18A     FIG. 18B     FIG. 18C
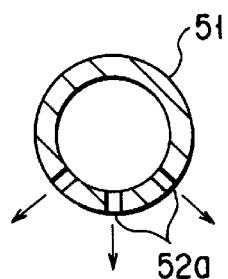
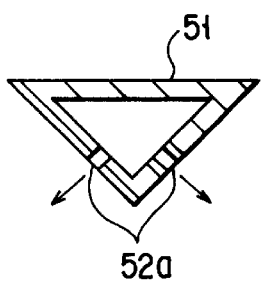
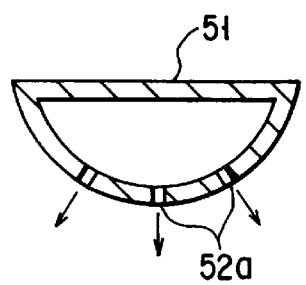
FIG. 19A     FIG. 19B     FIG. 19C

INDUCTIVELY-COUPLED-PLASMA-PROCESSING APPARATUS

CROSS-REFERENCE TO RELATED APPLICATIONS

This application is based upon and claims the benefit of priority from the prior Japanese Patent Applications No. 11-132618, May 13, 1999; No. 11-132619, May 13, 1999; and No. 11-132620, May 13, 1999, the entire contents of which are incorporated herein by reference.

BACKGROUND OF THE INVENTION

The present invention relates to an inductively-coupled-plasma-processing apparatus used in the field of semiconductor processing. More specifically, the present invention relates to an inductively-coupled-plasma (ICP)-processing apparatus for subjecting a target substrate, such as a substrate for liquid crystal displays (LCD), i.e., an LCD glass substrate, to a process, such as deposition, etching, or the like, while using plasma. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

In a manufacturing process of a liquid crystal display (LCD), the surface of a rectangular glass-made LCD glass substrate is subjected to a process, such as deposition or etching. As an apparatus for executing this process using plasma, an inductively-coupled-plasma-processing apparatus capable of generating high-density plasma is known.

In a typical structure of the inductively-coupled-plasma-processing apparatus, a dielectric panel (window panel) is formed on the ceiling of an airtight process chamber, and a radio-frequency (RF) antenna is arranged above the dielectric panel. The RF antenna generates an inductive electric field in the process chamber and the field causes a process gas to be turned into plasma. Using this plasma, the substrate in the process chamber is subjected to a process such as deposition or etching.

Usually, target substrates (LCD glass substrates) to be processed in LCD manufacturing processes each have a size enough to obtain a plurality of LCD panel products, for example, nine LCD panel products, from one substrate. The sizes are therefore considerably greater than those of LCDs on the market. Recently the LCD glass substrates have been increased in size more and more in accordance with upsizing of LCDs themselves. For example, a 1-square-millimeter LCD glass substrate has appeared.

For the above reason, an inductively-coupled-plasma-processing apparatus for processing an LCD glass substrate increases in size, and so does a dielectric panel arranged between the LCD glass substrate and the RF antenna. The dielectric panel is thickened according to an increase in plan-view size so as to have strength enough to withstand a difference in pressure between the inside and outside of a process chamber and the dead weight thereof. If, however, the dielectric panel increases in thickness, the distance between the RF antenna and the process chamber increases, which causes a decrease in energy efficiency.

U.S. Pat. No. 5,589,737 discloses a structure for countering the above problem of the inductively-coupled-plasma-processing apparatus. In this structure, a main vessel is partitioned into an upper antenna chamber and a lower process chamber by means of a dielectric panel. A supporting frame having a plurality of rails, such as rails crossing each other at the center of the main vessel, is arranged in accordance with the partitioning position of the main vessel, and the dielectric panel is placed on the supporting frame. The dielectric panel comprises a plurality of segments corresponding to the rails of the supporting frame.

According to the structure of U.S. Pat. No. 5,589,737, the weight of the dielectric panel and the pressure difference between the inside and outside of the process chamber are all sustained finally by the outer section of the supporting frame extending along the inner surface of the main vessel. For this reason, the dielectric panel is still easy to bend downward in the central part, irrespective the presence of the rails of the supporting frame. In order to lessen this phenomenon, the entire supporting frame has to be sturdy; however, in this case, it increases in size and weight and causes an undesirable effect from the viewpoint of the profile in the process chamber, and the operability, maintenance and costs of the apparatus.

BRIEF SUMMARY OF THE INVENTION

One object of the present invention is to provide an inductively-coupled-plasma-processing apparatus wherein a dielectric panel, which is arranged in the ceiling of a process chamber for an RF antenna, can be reduced in thickness even though it increases in plan-view size as the apparatus increases in size, thereby preventing the RF antenna from decreasing in energy efficiency.

Another object of the present invention is to provide an inductively-coupled-plasma-processing apparatus wherein a dielectric panel is arranged in the ceiling of a process chamber for an RF antenna, which is improved in order to counter various problems caused by upsizing of the apparatus.

According to a first aspect of the present invention, there is provided an inductively-coupled-plasma-processing apparatus, comprising:

an airtight process chamber;

a worktable on which a target substrate is placed in the process chamber;

a process gas supply system for supplying a process gas into the process chamber;

an exhaust system for exhausting the process chamber and setting the process chamber at a vacuum;

a dielectric panel arranged in a ceiling of the process chamber;

an RF antenna arranged outside the process chamber to face the dielectric panel, the RF antenna generating an inductive electric field for turning the process gas into plasma in the process chamber;

an overhead frame arranged above the dielectric panel;

a suspender arranged at a distance from a peripheral edge of the dielectric panel so as to impose a load of the dielectric panel on the overhead frame; and a showerhead arranged between the worktable and the dielectric panel and including a shower case having a gas flow path connected to the process gas supply system and a plurality of gas supply holes opened to the worktable, the shower case being connected to the suspender and having a portion extending in parallel to the dielectric panel to serve as a supporting bracket for supporting the dielectric panel.

According to a second aspect of the present invention, there is provided an inductively-coupled-plasma-processing apparatus comprising:

an airtight process chamber;

a worktable on which a target substrate is placed in the process chamber;

a process gas supply system for supplying a process gas into the process chamber;

an exhaust system for exhausting the process chamber and setting the process chamber at a vacuum;

a dielectric panel arranged in a ceiling of the process chamber;

an RF antenna arranged outside the process chamber to face the dielectric panel, the RF antenna generating an inductive electric field for turning the process gas into plasma in the process chamber;

an overhead frame arranged above the dielectric panel;

a suspender arranged at a distance from a peripheral edge of the dielectric panel so as to impose a load of the dielectric panel on the overhead frame; and a metal supporting bracket connected to the suspender and having a portion extending in parallel to the dielectric panel, for supporting the dielectric panel.

According to a third aspect of the present invention, there is provided an inductively-coupled-plasma-processing apparatus comprising:

an airtight main vessel;

a dielectric panel for partitioning the main vessel into an upper antenna chamber and a lower process chamber;

a worktable on which a target substrate is placed in the process chamber;

a process gas supply system for supplying a process gas into the process chamber;

an exhaust system for exhausting the process chamber and setting the process chamber at a vacuum;

an RF antenna arranged in the antenna chamber to face the dielectric panel, the RF antenna generating an inductive electric field for turning the process gas into plasma in the process chamber;

a suspender arranged at a distance from a peripheral edge of the dielectric panel so as to impose a load of the dielectric panel on a ceiling of the main vessel; and a supporting bracket connected to the suspender and arranged to support the dielectric panel.

According to a fourth aspect of the present invention, there is provided an inductively-coupled-plasma-processing apparatus comprising:

an airtight process chamber;

a worktable on which a target substrate is placed in the process chamber;

a process gas supply system for supplying a process gas into the process chamber;

an exhaust system for exhausting the process chamber and setting the process chamber at a vacuum;

a dielectric panel arranged in a ceiling of the process chamber;

an RF antenna arranged outside the process chamber to face the dielectric panel, the RF antenna generating an inductive electric field for turning the process gas into plasma in the process chamber;

a supporting bracket having a portion extending in parallel to the dielectric panel and arranged to support the dielectric panel, the dielectric panel being placed on the supporting bracket; and a dielectric cover for covering a bottom surface of the dielectric panel and that of the supporting bracket.

According to a fifth aspect of the present invention, there is provided an inductively-coupled-plasma-processing apparatus comprising:

an airtight process chamber;

a worktable on which a target substrate is placed in the process chamber;

a process gas supply system for supplying a process gas into the process chamber;

an exhaust system for exhausting the process chamber and setting the process chamber at a vacuum;

a dielectric panel arranged in a ceiling of the process chamber;

an RF antenna arranged outside the process chamber to face the dielectric panel, the RF antenna generating an inductive electric field for turning the process gas into plasma in the process chamber; and a showerhead arranged between the worktable and the dielectric panel and including a substantially metal shower case having a gas flow path connected to the process gas supply system and a plurality of gas supply holes opened to the worktable.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a schematic perspective view illustrating a relationship between a dielectric panel and suspenders of the apparatus shown in FIG. 7;

FIGS. 9A and 9B are an enlarged sectional view of a connecting portion of a dielectric panel and a suspender of the apparatus shown in FIG. 7 and an enlarged sectional view of a modification to the connecting portion;

FIG. 10 is a perspective view of a modification to a partition structure of the apparatus shown in FIG. 7;

FIGS. 11A and 11B are an enlarged sectional view of a connecting portion of a dielectric panel and a suspender of the modification shown in FIG. 10 and an enlarged sectional view of a modification to the connecting portion;

FIGS. 18A to 18C are views each showing a modification to a combination of an antenna and a reinforcing bracket of the apparatus shown in FIG. 15;

FIGS. 19A to 19C are views each showing a modification to a reinforcing bracket/shower case of the apparatus shown in FIG. 15;

DETAILED DESCRIPTION OF THE INVENTION

Figure 1:
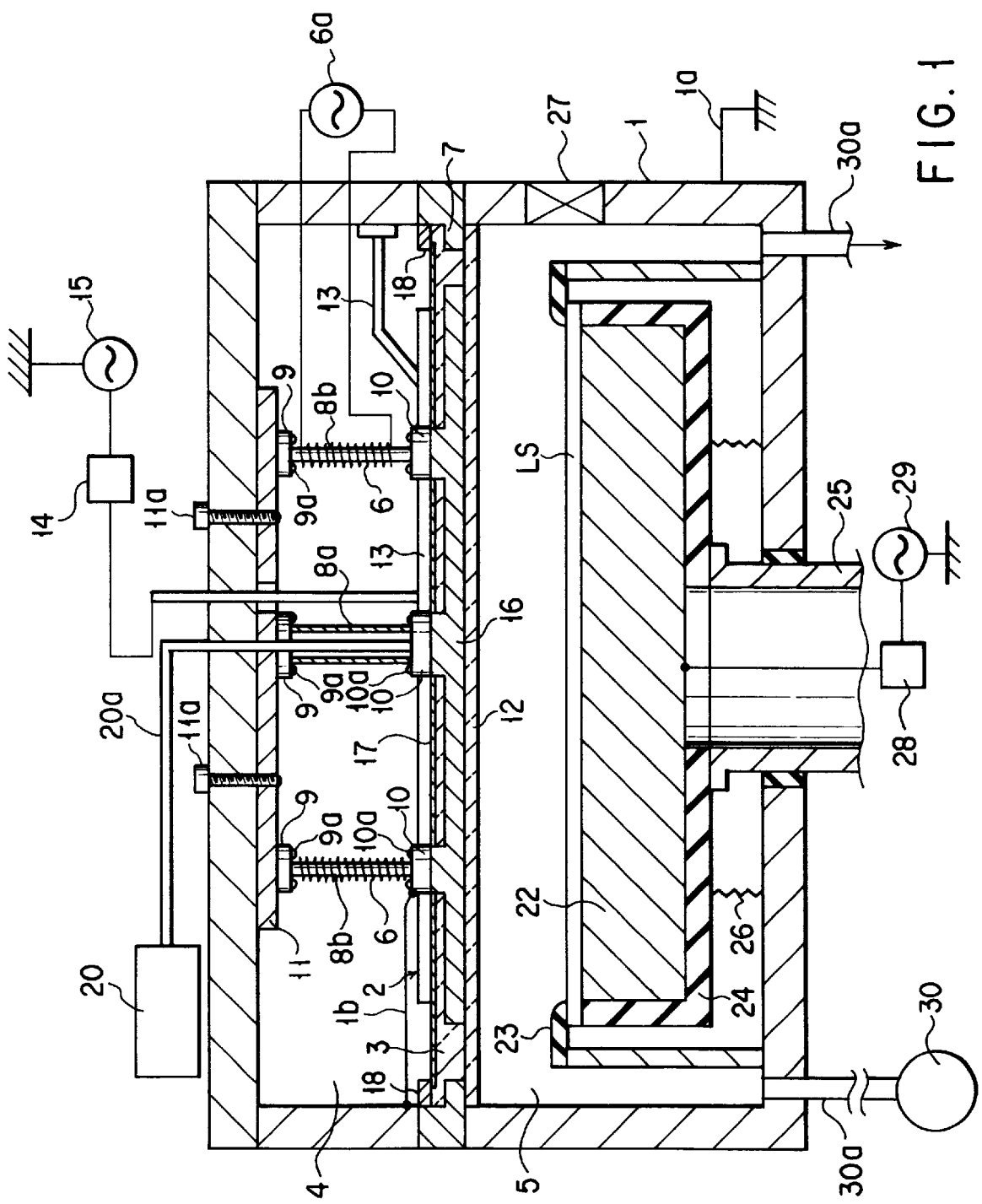
FIG. 1 is a sectional front view showing an inductively-coupled-plasma-etching apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a sectional front view showing an inductively-coupled-plasma-etching apparatus according to an embodiment of the present invention. This apparatus is used for patterning a polysilicon film or an amorphous silicon film in order to form a TFT (Thin Film Transistor) on an LCD glass substrate in the process of manufacturing an LCD.

As illustrated in FIG. 1, the plasma etching apparatus includes an airtight main vessel 1 which is constituted of a housing of conductive materials such as aluminum and which can be disassembled. The main vessel 1 is grounded by a ground wire 1a. The inner surface of the main vessel 1 is anodized by anode oxidation to prevent a contaminant from being produced from the surface. The main vessel 1 is partitioned into an upper antenna chamber 4 and a lower process chamber 5 airtightly by a partition structure 2. In accordance with the position of the partition structure 2, a supporting shelf 7 is arranged on the inner surface of the main vessel 1 to define two horizontal shelf surfaces 7a and 7b (see FIG. 3).

Figure 2:
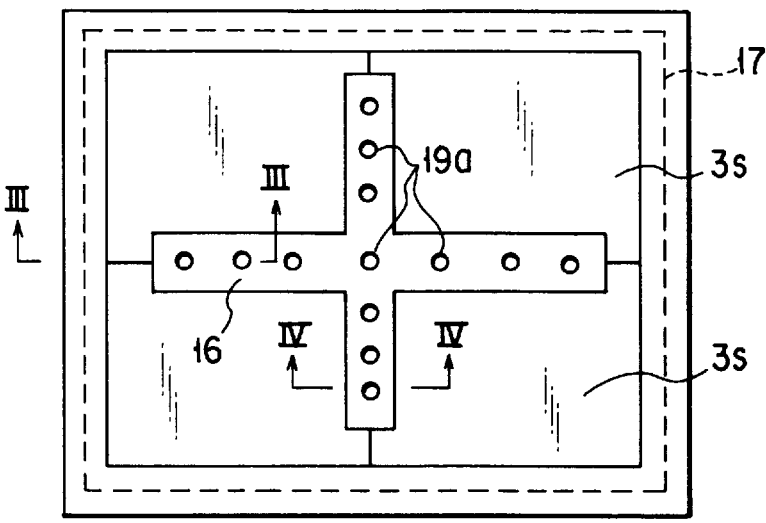
FIG. 2 is a bottom view showing a partition structure of the apparatus of FIG. 1, excluding a lower cover thereof.
Figure 3:
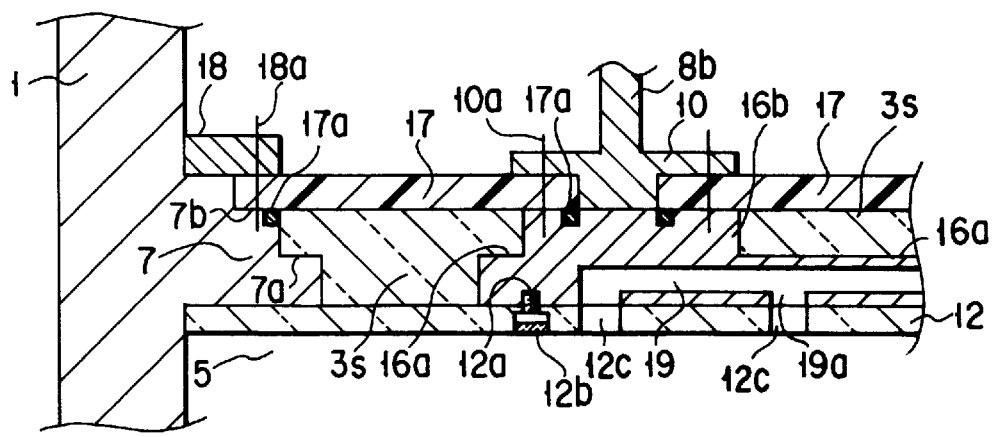
FIG. 3 is a sectional view of the partition structure taken along line III—III of FIG. 2.
Figure 4:
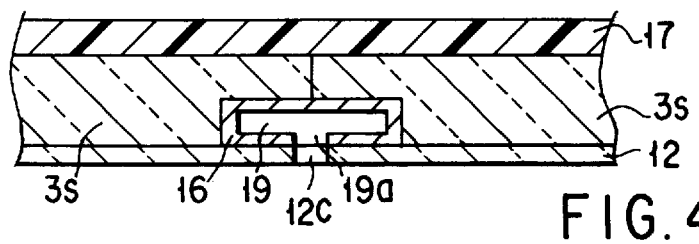
FIG. 4 is a sectional view of the partition structure taken along line IV—IV of FIG. 2.

FIG. 2 is a bottom view showing the partition structure 2 excluding a lower cover thereof, and FIGS. 3 and 4 are sectional views of the structure 2 taken along lines III—III and IV—IV of FIG. 2, respectively.

The partition structure 2 includes a dielectric panel 3, which is constituted of a combination of four quartz-made segments 3s having substantially the same size and having a thickness of about 30 mm. The periphery of the dielectric panel 3 is placed on the lower shelf surface 7a of the supporting shelf 7. A symmetrical, cross-shaped supporting-and-reinforcing bracket 16 is arranged in the center of the main vessel 1 in accordance with a position where the segments 3s are adjacent to each other. The supporting bracket 16 is suspended from the ceiling of the main vessel 1 to maintain its horizontal state by means of a plurality of suspenders 8a and 8b (described later) arranged at a distance from the peripheral edge of the dielectric panel 3. The bracket 16 has a horizontal supporting surface 16a other than circular projections 16b for connecting the bracket 16 to the suspenders 8a and 8b. The opposing edges of the segments 3s are placed on the supporting surface 16a.

The peripheries of the segments 3s are provided with downward step portions, which are complementary in shape to the supporting shelf 7 and supporting bracket 16. In other words, the supporting shelf 7 and supporting bracket 16 are fitted into recesses in the bottom surface of the dielectric panel 3 defined by the step portions and thus the bottom surfaces of the shelf 7, bracket 16 and dielectric panel 3 are substantially flush with each other on the horizontal plane. These bottom surfaces are also covered with a dielectric cover 12 made of quartz having a smooth bottom surface. The cover 12 is fixed to the supporting bracket 16 by a plurality of screws 12a buried into its recesses. Each of the screws 12a is covered with a dielectric cap 12b made of quartz and buried into its corresponding recess of the cover 12. The bottom surfaces of the cover 12 and cap 12b are substantially flush with each other.

A resin plate 17, which is made of, e.g., PTFE (polytetrafluoroethylene, trade name: Teflon), is formed on the top of the dielectric panel 3. The resin plate 17 is a single plate placed on the upper shelf surface 7b of the supporting shelf 7 and the circular projections 16b of the supporting bracket 16 as well as the dielectric panel 3. A holding frame 18 is disposed along the periphery of the resin plate 17 and fixed to the supporting shelf 7 by a through screw 18a so as to catch the periphery of the resin plate 17.

The resin plate 17 has openings corresponding to the circular projections 16b of the supporting bracket 16 for connecting the bracket 16 to the suspenders 8a and 8b. A flange 10 is provided at the bottom of each of the suspenders 8a and 8b and fixed to the projection 16b by through screws 10a so as to catch the periphery of the opening of the resin plate 17. Seal rings 17a made of an elastic material are interposed between the resin plate 17 and the upper shelf surface 7b of the supporting shelf 7 and between the resin plate 17 and the circular projections 16b of the supporting bracket 16, thereby securing airtightness of the partition structure 2 for separating the antenna chamber 4 and process chamber 5 from each other.

Figure 5:
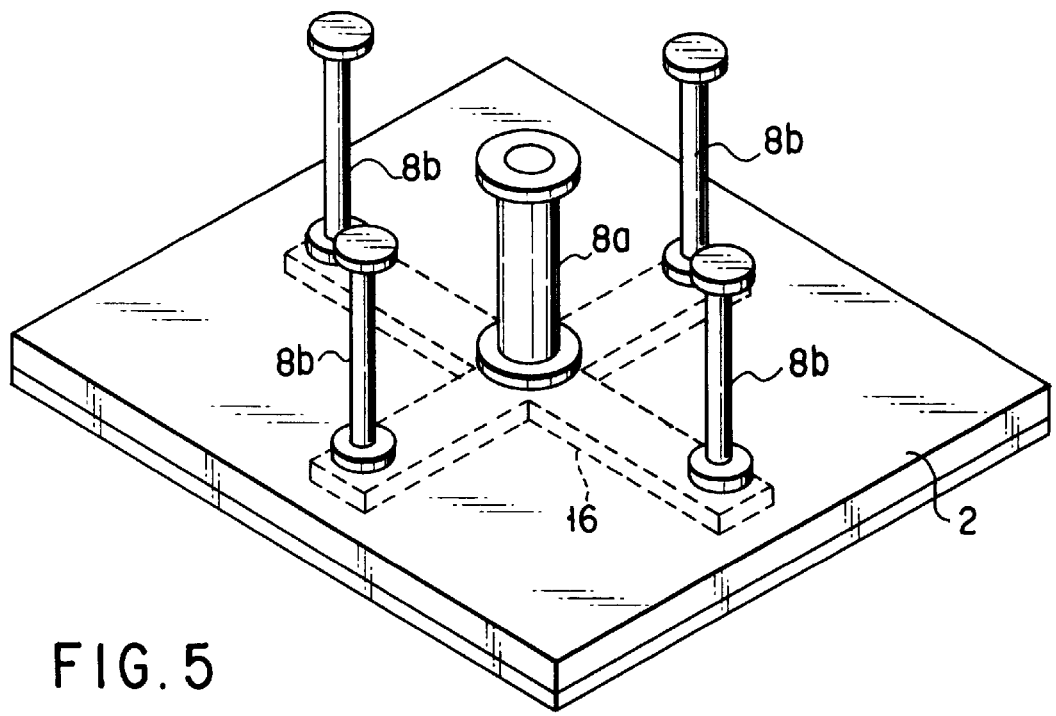
FIG. 5 is a schematic perspective view illustrating a relationship between the partition structure and suspenders of the apparatus shown in FIG. 1.

FIG. 5 is a schematic perspective view showing a relationship between the partition structure 2 and suspenders 8a and 8b of the apparatus illustrated in FIG. 1. The suspenders 8a and 8b comprise one tube-like suspender 8a connected to the center of the supporting bracket 16 and four rod-like solid suspenders 8b connected to the end portions of the cross of the bracket 16. These suspenders 8a and 8b vertically extend from the ceiling of the main vessel 1 to the partition structure 2, and the flange 10 is provided at the bottom of each of the suspenders, while a similar flange 9 is provided at the top thereof.

The flanges 9 of the suspenders 8a and 8b are fixed to a coupling plate 11 by means of screws 9a. The coupling plate 11 is fixed to the ceiling of the main vessel 1 by a plurality of bolts 11a penetrating the ceiling. Since the suspenders 8a and 8b and the members 9, 10 and 11, screws 9a and 10a, and bolts 11a for mounting the suspenders do not contact plasma, they are all formed of stainless steel having high mechanical strength. The supporting bracket 16 is connected to the main vessel 1 through a ground wire 1b and thus grounded via the ground wire 1b, main vessel 1 and ground wire 1a.

A coil-like resistance heater 6 is arranged to wind around each of the suspenders 8a and 8b and connected to a power supply 6a. The heater 6 heats the partition structure 2 including the dielectric panel 3 through the suspenders 8a and 8b and the supporting bracket 16, with the result that a by-product is prevented from being attached to the bottom surface of the partition structure 2 exposed to the process chamber 5 or the bottom surface of the dielectric cover 12.

The supporting bracket 16 is a hollow member made of conductive materials, preferably metal such as aluminum and used as a shower case for constituting a showerhead. The inner and outer surfaces of the shower case are anodized by anode oxidation to prevent a contaminant from being produced from the surface. The supporting bracket/shower case 16 includes a gas flow path 19, and a plurality of gas supply holes 19a formed in the bottom surface of the bracket 16. The holes 19a communicate with the gas flow path 19 and are opened to a susceptor or worktable 22 (described later). Holes 12c are formed in the dielectric cover 12 so as to correspond to the gas supply holes 19a of the shower case 16.

A gas supply tube 20a communicating with the gas flow path 19 in the supporting bracket 16 is arranged in the tube-shaped suspender 8a connected to the center of the supporting bracket 16A. The gas supply tube 20a penetrates the coupling plate 11 and the ceiling of the main vessel 1 and is connected to a process gas supply section 20. In other words, during a plasma process, a process gas is supplied from the process gas supply section 20 into the supporting bracket 16 through the gas supply tube 20a and then spouted from the gas supply holes 19a into the process chamber 5.

Figure 6:
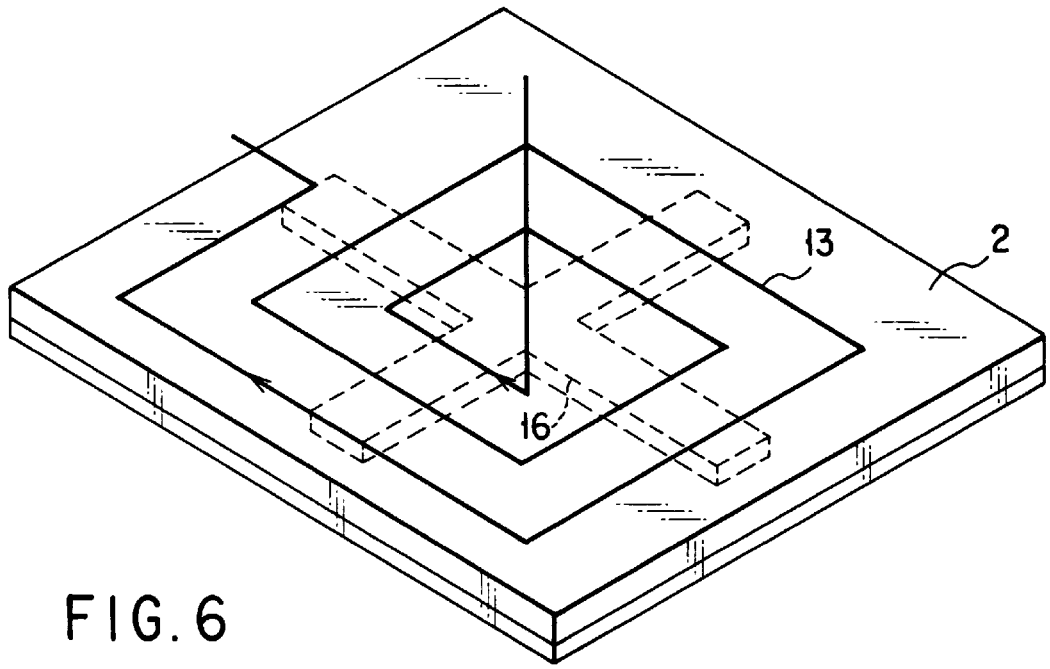
FIG. 6 is a schematic perspective view illustrating a relationship between the partition structure and an RF antenna of the apparatus shown in FIG. 1.

A radio-frequency (RF) antenna 13 is arranged on the partition structure 2 so as to face the dielectric panel 3 in the antenna chamber 4. FIG. 6 is a schematic perspective view showing a relationship between the partition structure 2 and the RF antenna 13 of the apparatus illustrated in FIG. 1. Referring to FIG. 6, the RF antenna 13 is constituted of a plane coil antenna which is formed like a square spiral on the partition structure 2. One end of the antenna 13, which is located at the center of the spiral, is extracted from the central part of the ceiling of the main vessel 1 and connected to an RF power supply 15 via a matching device 14, whereas the other end of the antenna 13, which is located at the outer side of the spiral is connected to the main vessel 1 and thus grounded.

During a plasma process, the power supply 15 applies RF power for generating an inductive electric field, such as a 13.56-MHz RF power, to the antenna 13. The antenna 13 forms an inductive electric field in the process chamber 5, and the inductive electric field turns the process gas supplied from the supporting bracket 16 into plasma. The power supply 15 is therefore set such that it can apply an RF power enough to generate plasma.

The susceptor or worktable 22, on which an LCD glass substrate LS is placed, is disposed in the process chamber 5 so as to face the RF antenna 13 with the dielectric panel 3 interposed therebetween. The susceptor 22 is formed of a conductive member, such as an aluminum-made member and its surface is anodized by anode oxidation to prevent a contaminant from being produced from the surface. A clamp 23 for fixing the substrate LS is arranged around the susceptor 22. When the substrate LS is located in a given position on the susceptor 22, the center of the cross-shaped supporting bracket 16 is substantially aligned with that of the substrate LS.

The susceptor 22 is housed in an insulation frame 24 and supported on a hollow column 25. The column 25 airtightly penetrates the bottom of the main vessel 1 and is supported by a elevating mechanism (not shown) provided outside the main vessel 1. In other words, the susceptor 22 is moved up and down by the elevating mechanism when the substrate LS is loaded/unloaded. A bellows 26 is formed between the insulation frame 24 and the bottom of the main vessel 1 so as to surround the column 25 airtightly, thereby securing airtightness of the process chamber 5. Further, a gate valve 27 is provided on the side of the process chamber 5 to load/unload the substrate LS.

The susceptor 22 is connected to an RF power supply 29 via a matching device 28 by means of a feeding rod arranged in the hollow column 25. During a plasma process, the power supply 29 supplies an RF power for biasing of, e.g., 380 KHz to the susceptor 22. This RF power is used for effectively attracting ions in plasma, excited in the process chamber 5, into the substrate LS.

The susceptor 22 includes a temperature control mechanism having a heating means, such as a ceramic heater, and a refrigerant flow path and a temperature sensor (neither of which is shown). The pipes and wires for these mechanism and members are guided from the main vessel 1 through the column 25.

A vacuum exhaust mechanism 30 including a vacuum pump is connected to the bottom of the process chamber 5 through an exhaust pipe 30a. The process chamber 5 is exhausted by the mechanism 30, and set and maintained at a vacuum atmosphere, e.g., a pressure atmosphere of 10 mTorr.

Plasma etching for an LCD glass substrate using the inductively-coupled-plasma-etching apparatus shown in FIG. 1, will now be described.

First the substrate LS is transferred through the gate valve 27 and placed on the susceptor 22 by means of a transfer mechanism and then fixed on the susceptor 22 by the clamp 23. A process gas containing etching gas, such as $SF_6$ gas, is supplied from the gas supply section 20 into the process chamber 5, and the chamber 5 is evacuated through the exhaust pipe 30a, thereby maintaining the process chamber 5 in a pressure atmosphere of, e.g., 10 mTorr.

Then, an RF power of 13.56 MHz is applied from the power supply 15 to the antenna 13 to generate a uniform inductive electric field in the process chamber 5 through the partition structure 2. The inductive electric field causes the process gas to be turned into plasma in the process chamber 5. This plasma is high-density inductively-coupled plasma. The ions in the plasma so generated are effectively attracted into the substrate LS by a 380-KHz RF power applied from the power supply 29 to the susceptor 22 and consequently the substrate LS is etched uniformly.

The following advantages can be obtained from the inductively-coupled-plasma-etching apparatus having the structure described above.

During etching, a downward force is exerted on the partition structure 2 including the dielectric panel 3 by gravitation and a difference in pressure between the inside and outside of the process chamber 5. Since, however, the dielectric panel 3 is suspended from the ceiling of the main vessel 1 by the plural suspenders 8a and 8b and the supporting bracket 16, the structure 2 is not warped downward. It is thus possible to thin the dielectric panel 3 and prevent the antenna 13 from decreasing in energy efficiency. Since, moreover, the dielectric panel 3 is constituted of a combination of plural segments 3s on the supporting bracket 16, it is easy to manufacture.

The metal supporting bracket 16, which is provided on the partition structure 2 including the dielectric panel 3, is employed as a shower case of a showerhead. The metal supporting bracket 16 is used as both of a reinforcing-and-supporting member and a processing-gas supply member and thus the parts of the chamber 5 can be prevented from increasing in number. The metal showerhead is superior in both workability and mechanical strength to a conventional showerhead formed of a dielectric such as quartz.

Since the supporting bracket/shower case 16 is made of metal, it serves as a shield of the antenna 13 to prevent a change of a process gas into plasma due to abnormal discharge in the gas flow path 19. Since, furthermore, the grounded supporting bracket 16 serves as an opposing electrode of the susceptor 22, a bias field can be prevented from expanding, and thus plasma can be prevented from expanding.

The supporting bracket 16 is so shaped that it extends in a direction substantially perpendicular to the direction in which the antenna extends and thus a degree at which the bracket 16 interferes with an inductive electric field generated from the antenna 13 is lowered. In other words, a decrease in the energy efficiency of the antenna 13, which is caused by interposing a metal member between the antenna 13 and the substrate LS, can be minimized.

In the partition structure 2, the bottom surfaces of the supporting shelf 7, supporting bracket 16 and dielectric panel 3 are covered with the dielectric cover 12 having a smooth bottom surface. In other words, the ceiling of the process chamber 5 has no irregularities, so that there occurs no problems such as damage due to plasma and difficulty in cleaning. If, in this respect, a supporting frame of a dielectric panel is protruded toward a process chamber as in the structure of U.S. Pat. No. 5,589,737, electrons in plasma accelerated by an electric field generated in an angular direction collide with the supporting frame and damage it. In this case, particles of the damaged frame and ions whose energy is lost are deposited on the side of the frame and thus the supporting frame needs cleaning frequently; however, the cleaning is not easy because of a step between the dielectric panel and the supporting frame.

In the foregoing embodiment, the suspenders 8a and 8b are supported on the ceiling of the main vessel 1 or that of the antenna chamber 4. The present invention is not limited to this. For example, an overhead frame can be arranged above the process chamber and the suspenders 8a and 8b can be attached to the overhead frame. This structure can be used in an apparatus including no antenna chamber surrounding an antenna.

Figure 7:
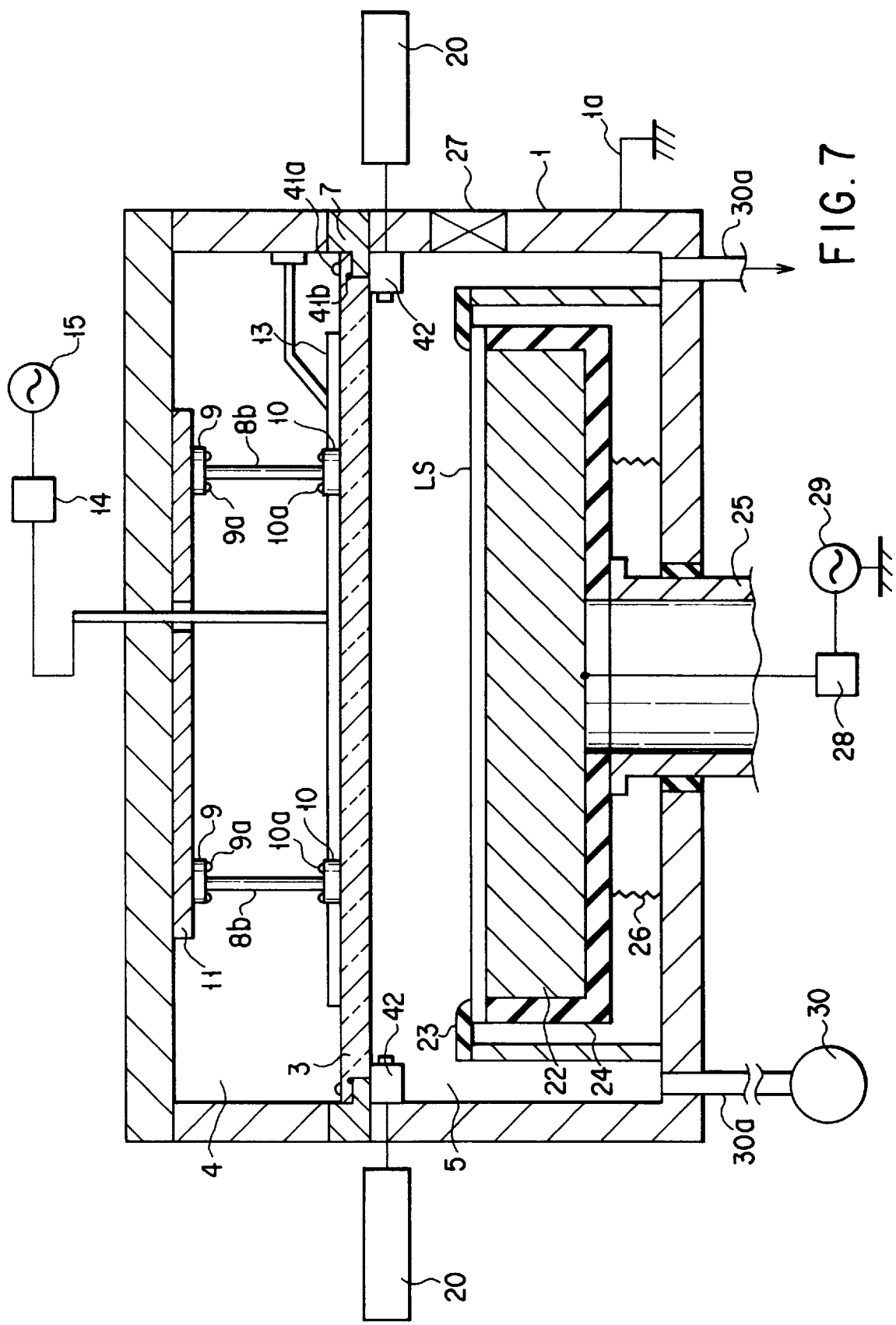
FIG. 7 is a sectional front view showing an inductively-coupled-plasma-etching apparatus according to another embodiment of the present invention.

FIG. 7 is a sectional front view showing an inductively-coupled-plasma-etching apparatus according to another embodiment of the present invention. This embodiment is directed to a more simple etching apparatus having the feature in which a dielectric panel is suspended from the ceiling of a main vessel by suspenders. However, s partition structure of the apparatus shown in FIG. 7 is somewhat different from that of the apparatus shown in FIG. 1.

In the apparatus of FIG. 7, a dielectric panel 3 has a thickness of about 30 mm and its outer edge is fixed to a supporting shelf 7, which is protruded from the inner wall of the main vessel 1, by screws 41a. A seal ring 41b made of elastic members is interposed between the dielectric panel 3 and the supporting shelf 7 and thus an antenna chamber 4 and a process chamber 5 are airtightly separated from each other. The dielectric panel 3 is suspended from the ceiling of the main vessel 1 by four suspenders 8b around the central part of the dielectric panel 3 or at a distance from the peripheral edge thereof.

FIG. 8 is a schematic perspective view showing a relationship between the dielectric panel 3 and one of the suspenders 8b in the apparatus shown in FIG. 7, and FIG. 9A is an enlarged sectional view of a connecting portion of the dielectric panel 3 and one of the suspenders 8b. Upper and lower flanges 9 and 10 are formed on both end portions of the suspender 8b integrally with each other. The upper flange 9 is fixed on the ceiling by screws 9a, while the lower flange 10 is fixed on the top of the dielectric panel 3 by screws 10a. The apparatus may be so constituted that the suspender 8b penetrates the dielectric panel 3 and the flange 10 is mounted on the bottom surface of the dielectric panel 3 by the screw 10a, as illustrated in FIG. 9B.

The apparatus shown in FIG. 7 includes no equivalent for the supporting bracket/shower case 16 of the apparatus shown in FIG. 1. Therefore, a process gas is supplied into the process chamber 5 from a plurality of jet nozzles 42 arranged under the supporting shelf 7.

The partition structure of the apparatus shown in FIG. 7 is not warped downward since the dielectric panel 3 is suspended from the ceiling of the main vessel 1 by the plural suspenders 8b. It is thus possible to thin the dielectric panel 3 and prevent the antenna 13 from decreasing in energy efficiency.

FIG. 10 is a perspective view of a modification to the partition structure of the apparatus shown in FIG. 7, and FIG. 11A is an enlarged sectional view showing a connecting portion of a dielectric panel 3 and suspenders 8b of the modification. In this modification, a supporting bracket 43 is shaped like a cross on the dielectric panel 3, and the suspenders 8b are connected to the supporting bracket 43. The bracket 43 is fitted into a recess in the bottom surface of the dielectric panel 3 such that the bottom surfaces of the bracket 43 and panel 3 are substantially flush with each other. The supporting bracket 43 allows the dielectric panel 3 to be suspended from the ceiling of the main vessel 1 more firmly. The supporting bracket 43 may be protruded from the bottom of the dielectric panel 3, as illustrated in FIG. 11B.

As described above, it is desirable to extend the supporting bracket 43 in a direction substantially perpendicular to a direction in which the antenna 13 extends, when the bracket 43 is made of metal. Thus, a decrease in the energy efficiency of the antenna 13, which is caused by interposing a metal member between the antenna 13 and the substrate LS, can be minimized.

Figure 12:
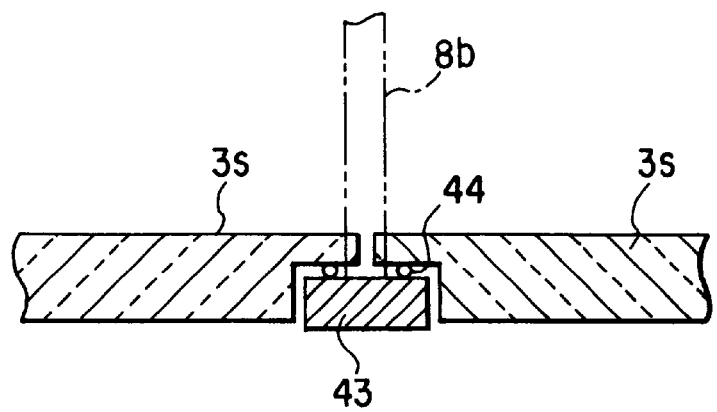
FIG. 12 is an enlarged sectional view of another modification to the partition structure of the apparatus shown in FIG. 7.

FIG. 12 is an enlarged sectional view of another modification to the partition structure of the apparatus shown in FIG. 7. In this modification, a dielectric panel 3 is constituted of a plurality of segments 3s combined on a supporting bracket 43, as in the apparatus shown in FIG. 1. A packing 44 made of elastic materials is provided between the supporting bracket 43 and an end portion of each segment 3s to airtightly separate an antenna chamber 4 and a process chamber 5 from each other. Since the dielectric panel 3 is constituted of the plural segments 3s, it can easily be manufactured.

Figure 13:
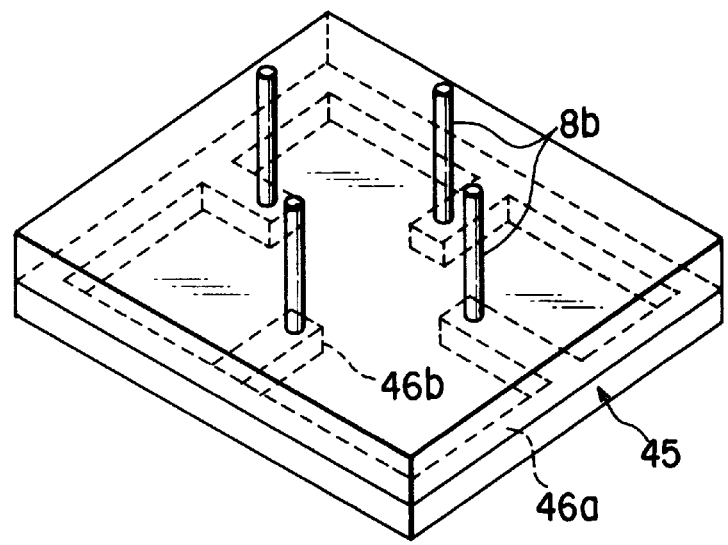
FIG. 13 is an enlarged sectional view of still another modification to the partition structure of the apparatus shown in FIG. 7.
Figure 14:
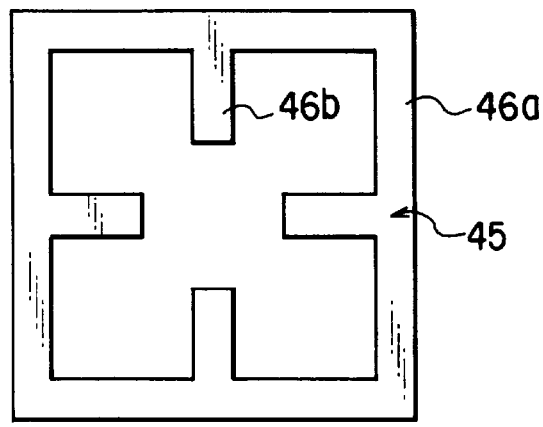
FIG. 14 is a plan view of a supporting frame of the modification shown in FIG. 13.

FIG. 13 is a perspective view of still another modification to the partition structure of the apparatus shown in FIG. 7, and FIG. 14 is a plan view showing a supporting frame of the modification. Referring to FIG. 13, a supporting frame 45 having the same outline as that of the dielectric panel 3 is prepared and the panel 3 is placed on the frame 45. The frame 45 includes a rectangular portion 46a and portions 46b extended inward from four sides of the portion 46a. Suspenders 8b are connected to the end portions of the extended portions 46b.

Figure 15:
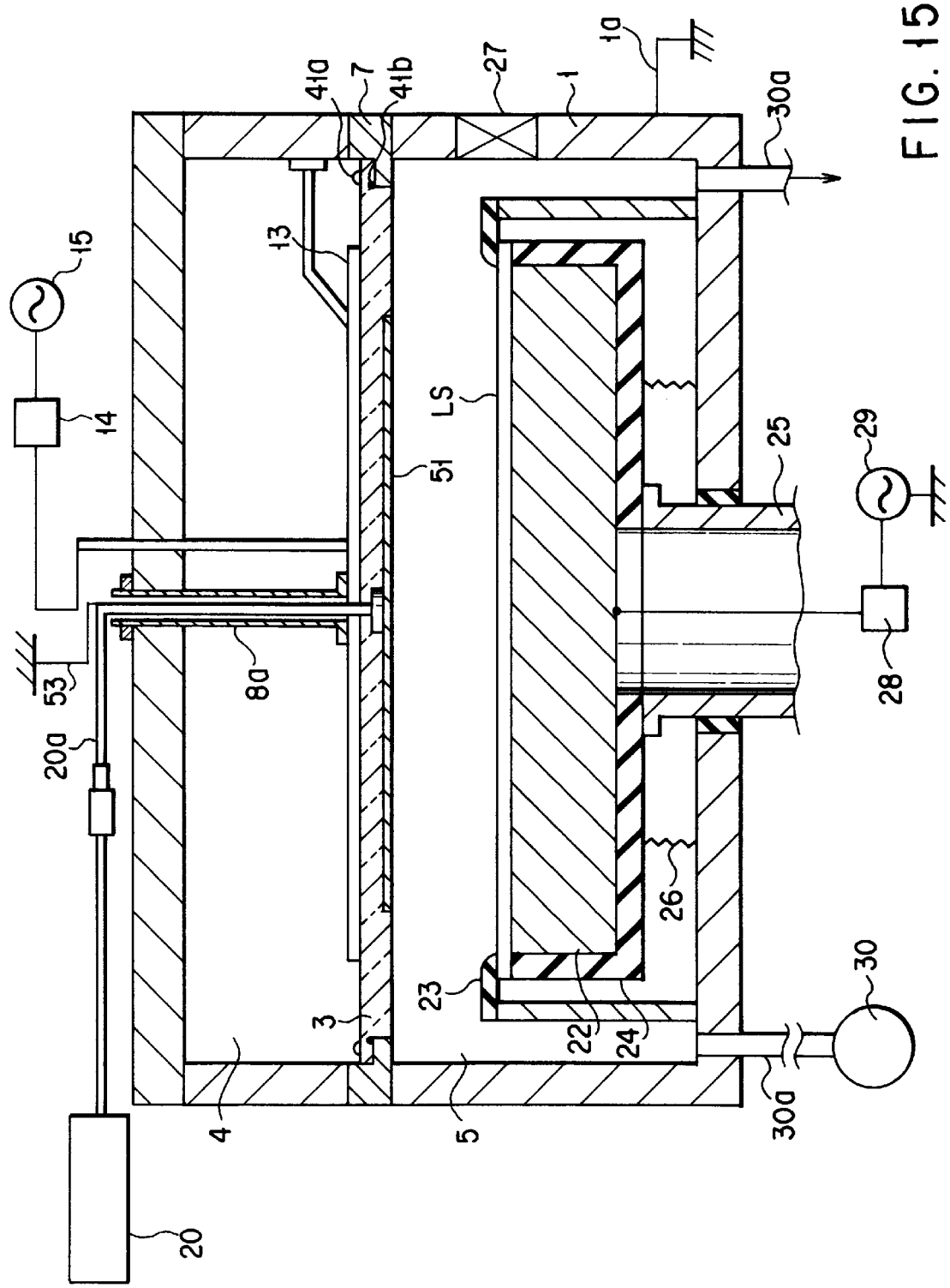
FIG. 15 is a sectional front view showing an inductively-coupled-plasma-etching apparatus according to still another embodiment of the present invention.

FIG. 15 is a sectional front view showing an inductively-coupled-plasma-etching apparatus according to still another embodiment of the present invention. This embodiment is directed to a more simple etching apparatus having the feature in which a metal supporting or reinforcing bracket for a dielectric panel 3 is used as a shower case.

The dielectric panel 3 is fixed on a supporting shelf 7, whose outer edge is protruded from the inner wall of the main vessel 1, by means of screws 41a. A seal ring 41b made of elastic materials is provided between the dielectric panel 3 and supporting shelf 7 to airtightly separate an antenna chamber 4 and a process chamber 5 from each other. A reinforcing bracket/shower case 51 is fitted into the central portion of the bottom surface of the dielectric panel 3.

Figure 16:
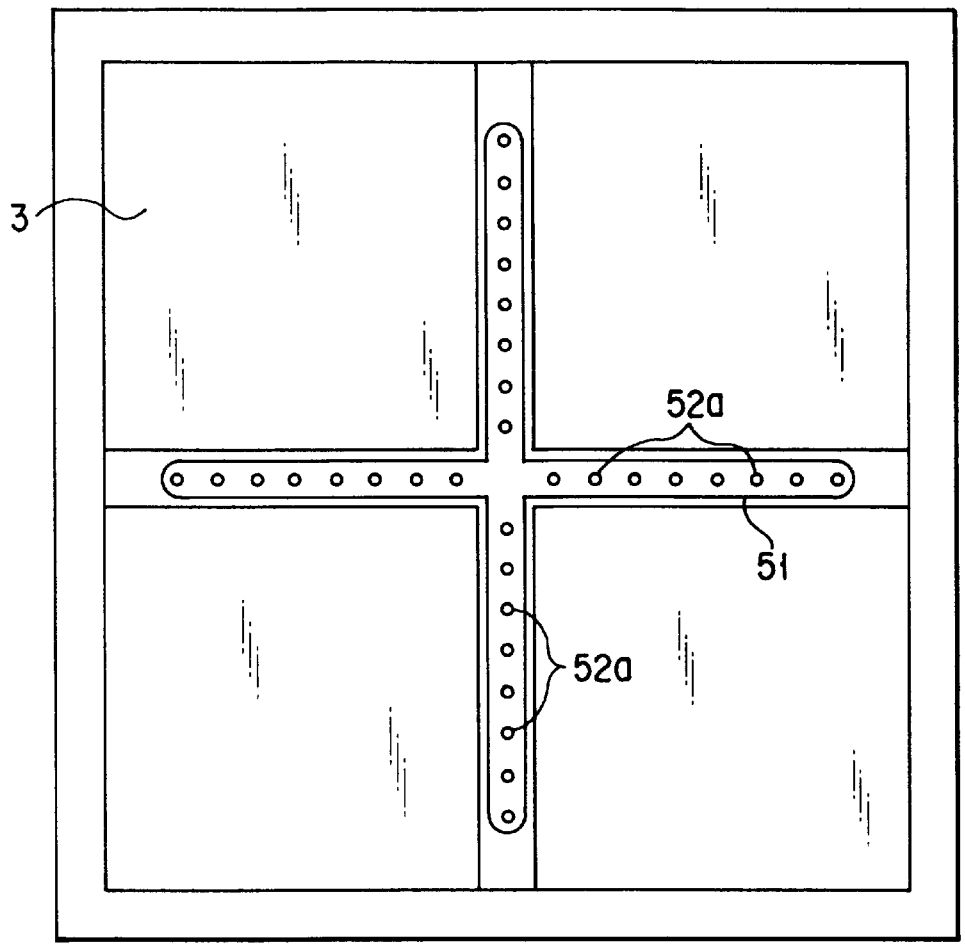
FIG. 16 is a bottom view illustrating a partition structure of the apparatus shown in FIG. 15.
Figure 17:
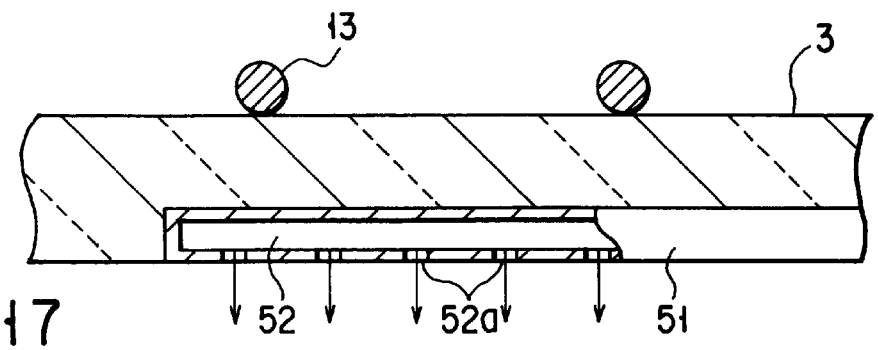
FIG. 17 is an enlarged sectional view showing a partition structure of the apparatus shown in FIG. 15.

FIGS. 16 and 17 are a bottom view and an enlarged sectional view illustrating a partition structure of the apparatus shown in FIG. 15. Like the supporting bracket 16 of the apparatus shown in FIG. 1, the reinforcing bracket 51 is shaped like a symmetrical cross and extends in a direction substantially perpendicular to a direction in which an antenna 13 extends (see FIG. 6). The bracket 51 is connected to the ceiling of the main vessel 1 by a single tube-like suspender 8a at the central part thereof. The bracket 51 is also fitted into a recess of the bottom surface of the dielectric panel 3 such that the bottom surfaces of the bracket 51 and panel 3 are substantially flush with each other.

Like the supporting bracket 16, the reinforcing bracket 51 is a hollow member made of conductive materials, preferably metal such as aluminum and used as a shower case for constituting a showerhead. The inner and outer surfaces of the shower case are anodized by anode oxidation to prevent a contaminant from being produced from the surface. A gas flow path 52 is formed in the reinforcing bracket 51, and a plurality of gas supply holes 52a are formed in the bottom surface of the bracket 51. The gas supply holes 52a communicate with the gas flow path 52 and are opened to a susceptor or worktable 22.

A gas supply tube 20a communicating with the gas flow path 19 in the reinforcing bracket 51, is arranged in the tube-shaped suspender 8a connected to the center of the bracket 51. The tube 20a penetrates the ceiling of the main vessel 1 and is connected to a process gas supply section 20 provided outside the main vessel 1. In other words, during a plasma process, a process gas is supplied from the supply section 20 into the reinforcing bracket 51 through the gas supply tube 20a and then spouted from the gas supply holes 52a into the process chamber 5. Furthermore, a ground wire 53 is formed along the gas supply tube 20 and accordingly the reinforcing bracket 51 is grounded.

The partition structure of the apparatus shown in FIG. 15 is used as both a member for reinforcing and supporting the dielectric panel 3 and a member for supplying a process gas and thus the parts of the chamber 5 can be prevented from increasing in number. The metal showerhead is superior in both workability and mechanical strength to a conventional showerhead formed of a dielectric such as quartz.

Since the reinforcing bracket/shower case 51 is made of metal, it serves as a shield of the antenna 13 to prevent a change of a process gas into plasma due to abnormal discharge in the gas flow path 52. Since, furthermore, the grounded bracket 51 serves as an opposing electrode of the susceptor 22, a bias field can be prevented from expanding, and thus plasma can be prevented from expanding.

The reinforcing bracket 51 is so shaped that it extends in a direction substantially perpendicular to the direction in which the antenna 13 extends and thus a degree at which the bracket 51 interferes with an inductive electric field generated from the antenna 13 is lowered. In other words, a decrease in the energy efficiency of the antenna 13, which is caused by interposing a metal member between the antenna 13 and the substrate LS, can be minimized.

FIGS. 18A to 18C are views each showing a modification to a combination of the antenna and reinforcing bracket of the apparatus shown in FIG. 15. In the modification shown in FIG. 18A, a single beam-shaped reinforcing bracket/shower case 54 extends in a radial direction with respect to a spiral plane coil antenna 13. According to the modification shown in FIG. 18B, a plurality of beams of a star reinforcing bracket/shower case 55 extends with respect to a spiral plane coil antenna 13. In the modification of FIG. 18C, an antenna 13 includes a plurality of long straight portions extending in parallel to each other. A reinforcing bracket/shower case is constituted of a plurality of beam portions 56 extending parallel to each other and perpendicularly to the straight portions of the antenna 13. In the modifications shown in FIGS. 18A to 18C, both the antenna and reinforcing bracket/shower case extend so as to cross each other at right angles, so that a degree at which the reinforcing bracket interferes with an inductive electric field generated from the antenna is lowered.

FIGS. 19A to 19C are views each showing a modification to the reinforcing bracket/shower case 51 of the apparatus illustrated in FIG. 15. These modifications have their respective circular, triangular and semicircular sections. The present invention is not particularly limited to these sections.

In the apparatus illustrated in FIG. 15, the reinforcing bracket/shower case 51 is suspended from the ceiling of the main vessel 1 by the single tube-like suspender 8a connected to the central part thereof, but the present invention is not limited to this feature. The advantage obtained when the metal reinforcing bracket 51 for the dielectric panel 3 is used as a shower case can be obtained even when the bracket 51 is not suspended by the suspender 8a.

Figure 20:
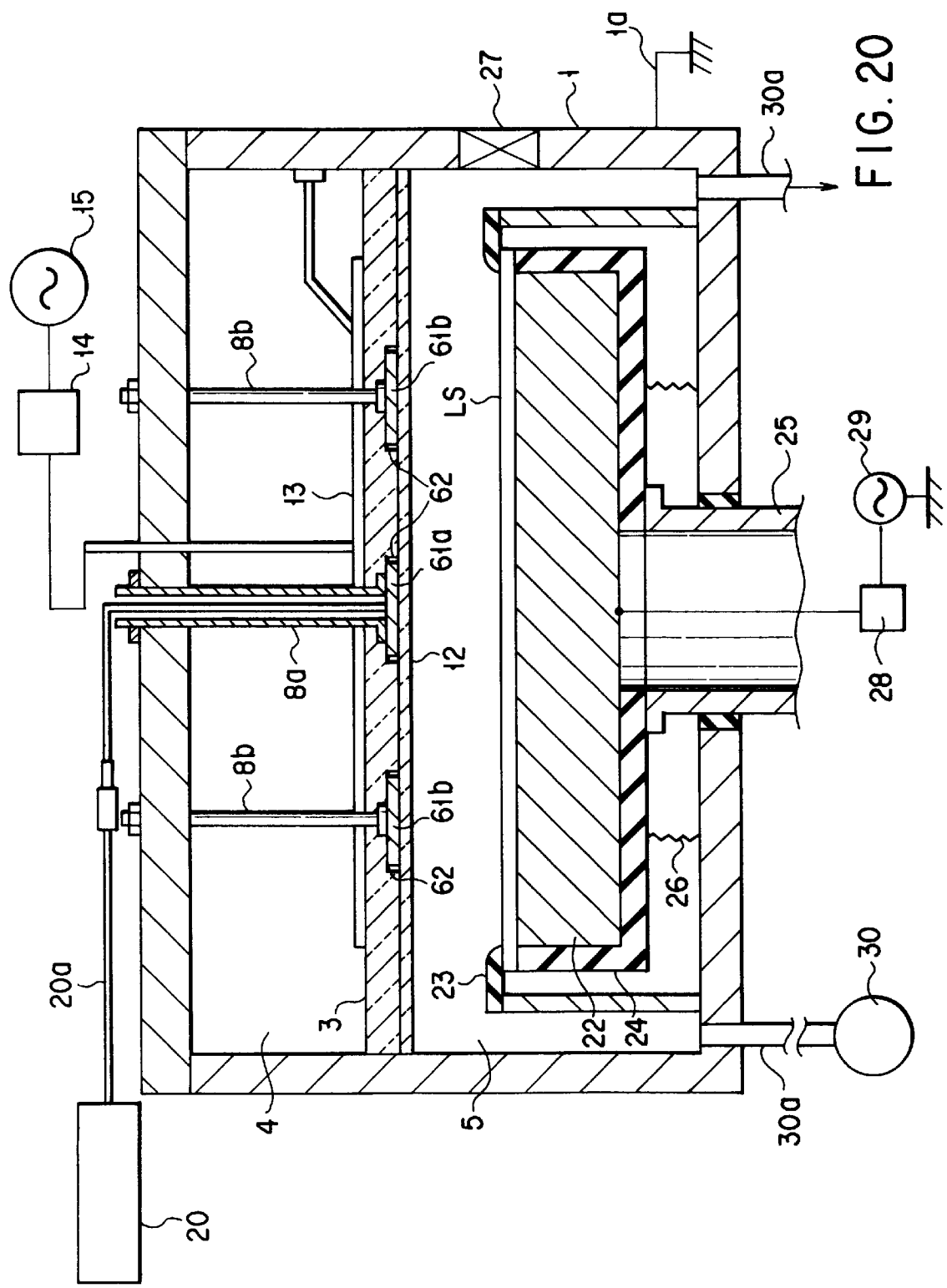
FIG. 20 is a sectional front view showing an inductively-coupled-plasma-etching apparatus according to still another embodiment of the present invention.

FIG. 20 is a sectional front view showing an inductively-coupled-plasma-etching apparatus according to still another embodiment of the present invention. This embodiment is directed to a more simple etching apparatus having the feature in which the bottom surface of a dielectric panel incorporating a supporting bracket is covered with a dielectric cover.

Figure 21:
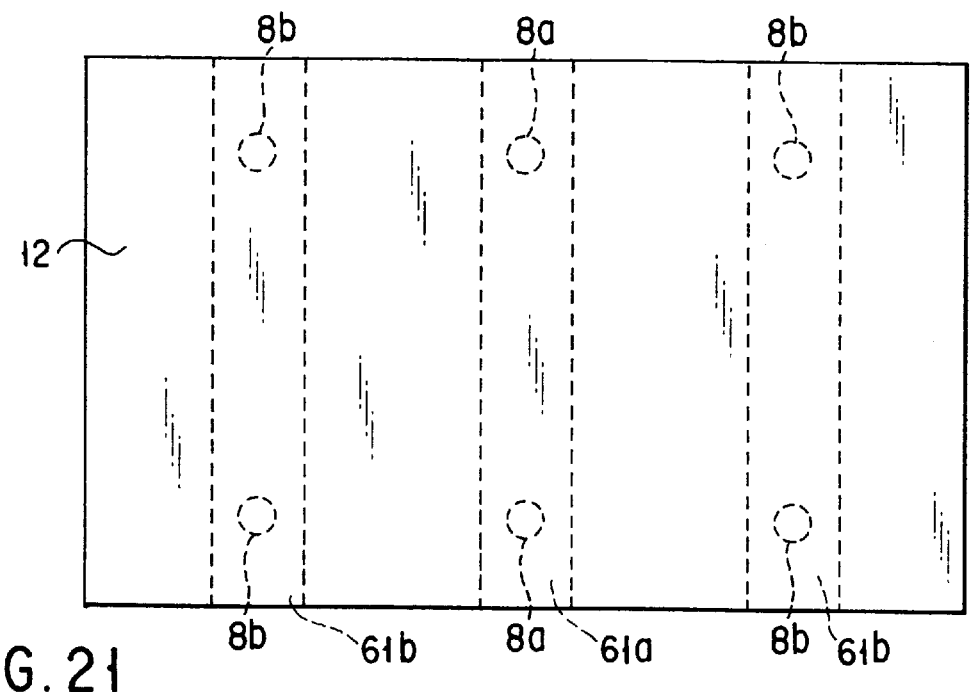
FIG. 21 is a bottom view showing a partition structure of the apparatus of FIG. 20.
Figure 22:
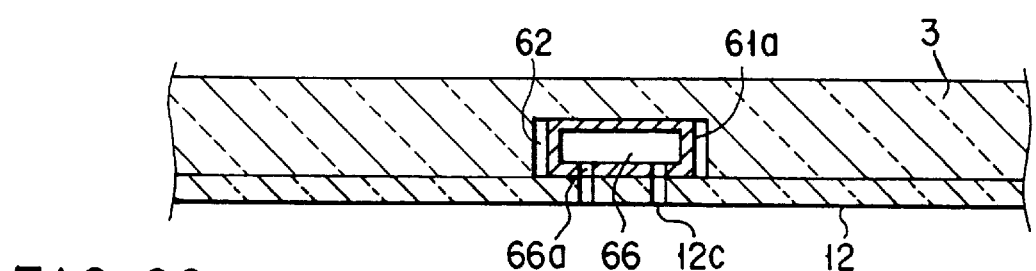
FIG. 22 is an enlarged sectional view showing a partition structure of the apparatus of FIG. 20.

In the apparatus shown in FIG. 20, no supporting shelf is arranged on the inner wall of a main vessel 1 and thus a dielectric panel 3 is supported by three supporting brackets 61a and 61b crossing the panel 3. FIGS. 21 and 22 are their respective bottom and enlarged sectional views of a partition structure of the apparatus shown in FIG. 20. Three groove portions 62 are formed in the bottom surface of the dielectric panel 3 in parallel and at regular intervals so as to face a susceptor 22. Supporting brackets 61a and 61b are arranged in their respective groove portions 62, and the bottom surfaces of the supporting brackets 61a and 61b and the dielectric panel 3 are substantially flush with each other.

The middle supporting bracket 61a is connected to the ceiling of the main vessel 1 by two tube-like suspenders 8a and its right and left supporting brackets 61b are connected thereto by their respective two rod-like solid suspenders 8b. In other words, the dielectric panel 3 is suspended from the ceiling of the main vessel 1 by means of six suspenders 8a and 8b and three supporting brackets 61a and 61b. The suspenders 8a and 8b are directly attached to the ceiling of the case 1 by screws and nuts. The supporting brackets 61a and 61b are made of conductive materials, preferably metal such as aluminum, and their surfaces are anodized by anode oxidation to prevent a contaminant from being produced from the surfaces. The brackets 61a and 61b are grounded through the suspenders 8a and 8b.

The right and left supporting brackets 61b are each used as a mere bracket, while the middle supporting bracket 61a is used as a shower case for constituting a showerhead as well as a bracket. In other words, the supporting bracket/shower case 61a includes a gas flow path 66 and a plurality of gas supply holes 66a formed on the bottom surface thereof. The gas supply holes 66a communicate with the gas flow path 66 and are opened to the susceptor 22.

The bottom surfaces of the supporting brackets 61a and 61b and the dielectric panel 3 are covered with a dielectric cover 12 made of quartz having a smooth bottom surface. The dielectric cover 12 includes holes 12c corresponding to the gas supply holes 66a of the supporting bracket/shower case 61. The cover 12 is fixed to the supporting brackets 61a and 61b by a plurality of screws buried into recesses thereof, as in the embodiment shown in FIG. 3.

A gas supply tube 20a, which communicates with the gas flow path 66 in the supporting bracket/shower case 61a, is arranged in the tube-like suspender 8a connected to the middle supporting bracket 61a. The gas supply tube 20a penetrates the ceiling of the main vessel 1 and is connected to a process gas supply section 20 provided outside the main vessel 1. In other words, during a plasma process, the process gas is supplied from the supply section 20 to the supporting bracket/shower case 61a via the gas supply tube 20a and then spouted from the gas supply holes 66a of the case 61a into a process chamber 5.

In the partition structure of the apparatus shown in FIG. 20, the bottom surfaces of the supporting brackets 61a and 61b and the dielectric panel 3 are covered with the dielectric cover 12 having a smooth bottom surface. Since the ceiling of the process chamber 5 has no irregularities, there occurs no problems of U.S. Pat. No. 5,589,737 described above, such as damage due to plasma and difficulty in cleaning.

Figure 23:
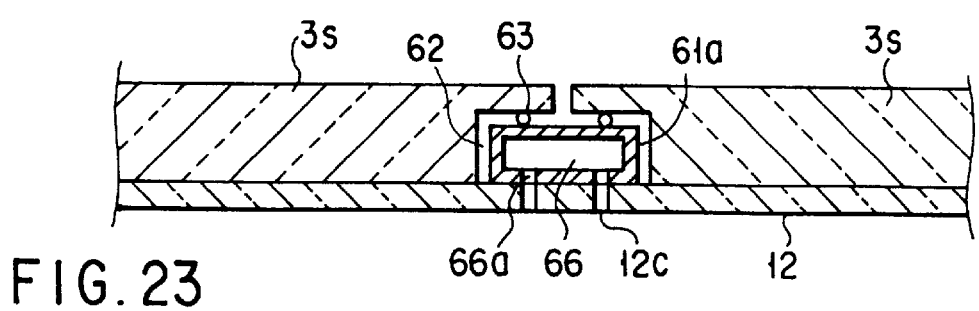
FIG. 23 is an enlarged sectional view of a modification to a partition structure of the apparatus shown in FIG. 20.

FIG. 23 is an enlarged sectional view of a modification to the partition structure of the apparatus shown in FIG. 20. In this modification, a dielectric panel 3 is constituted of a plurality of segments 3s combined on a supporting bracket 61a, as in the apparatus illustrated in FIG. 1. A packing 63 made of elastic materials is provided between the supporting bracket 61a and an end portion of each segment 3s to airtightly separate an antenna chamber 4 and a process chamber 5 from each other. Since the dielectric panel 3 is constituted of the plural segments 3s, it is easy to manufacture.

In the apparatus shown in FIG. 20, the supporting brackets 61a and 61b are suspended from the ceiling of the main vessel 1 by a plurality of suspenders 8a and 8b; however, the present invention is not limited to this feature. The advantage obtained when the dielectric cover covers the bottom surface of the dielectric panel 3 combined with the supporting brackets 61a and 61b can be obtained even when the supporting brackets are not suspended by the suspenders 8a and 8b.

Figure 24:
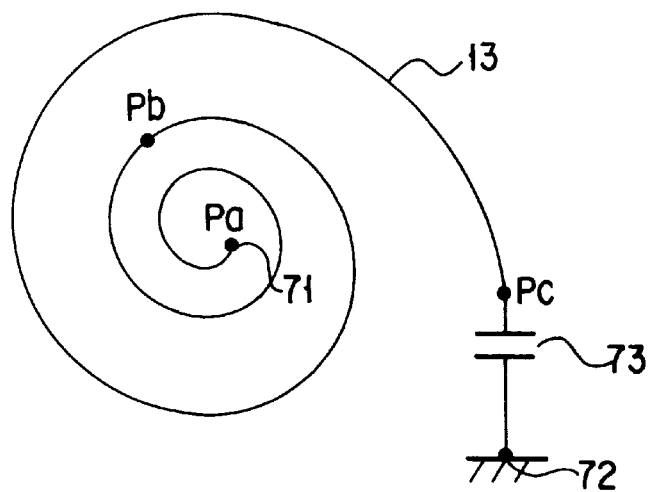
FIG. 24 is a view of a modification to an RF antenna.

FIG. 24 is a view showing a modification to the RF antenna 13. As the inductively-coupled-plasma-etching apparatus increases in size, the antenna is lengthened and thus its impedance is heightened. If the impedance is heightened, the potential of the feeding section of the antenna increases, the current flowing through the antenna decreases, and the plasma density lowers. The modification shown in FIG. 24 counters such a problem and can be applied to all the embodiments described above.

As illustrated in FIG. 24, a spiral plane coil antenna section of the antenna includes a power supply point 71 connected to an RF power supply 15 (see FIG. 1, for example) at the center thereof and a ground point 72, which is grounded through the main vessel 1, at one end thereof. A single capacitor 73 is connected in series between a ground-side terminal Pc of the antenna 13 and the ground point 72. The capacitance of the capacitor 73 is determined such that the impedance thereof is half that of the antenna 13. Since, therefore, the capacitor 73 is arranged in series with the antenna 13, the impedance of the antenna section can be reduced and the potential of the power supply point of the antenna can be lowered, and the current flowing through the antenna can be increased.

Figure 25:
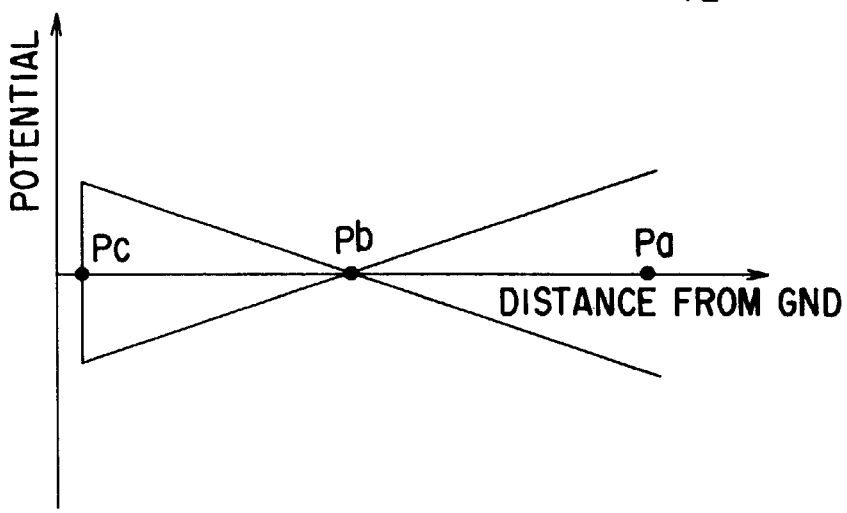
FIG. 25 is a graph showing a relationship between the distance from a ground and the potential in the antenna illustrated in FIG. 24.
Figure 26:
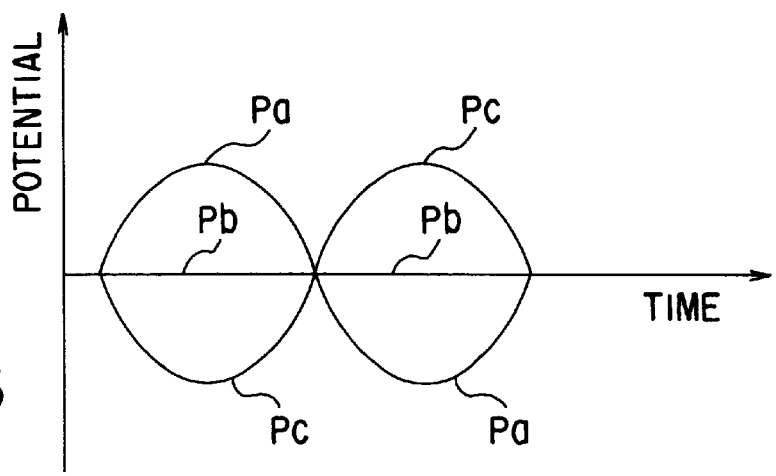
FIG. 26 is a graph of RF waveforms in the antenna illustrated in FIG. 24.

FIG. 25 is a diagram showing a relationship between the distance from the ground point and the potential of the antenna 13 in FIG. 24, and FIG. 26 is a diagram showing RF waveforms in the antenna 13. Assuming, as shown in FIG. 25, that the power supply point 71 of the center of the antenna is Pa, the midpoint thereof is Pb, and the ground-side terminal is Pc, the potential at Pb is zero and the potentials at Pa and Pc are about half the potential at Pa when the antenna is grounded directly but not through the capacitor 73. The RF waveforms at Pa, Pb and Pc are those as shown in FIG. 26.

Even though the antenna 13 is lengthened as the processing apparatus increases in size, a difference in potential between the power supply point 71 (Pa) and a nearby portion (Pc) of the ground point is lessened and the current flowing through the antenna 13 is increased. It is thus possible to generate induction plasma uniformly and at high densities.

Figure 27:
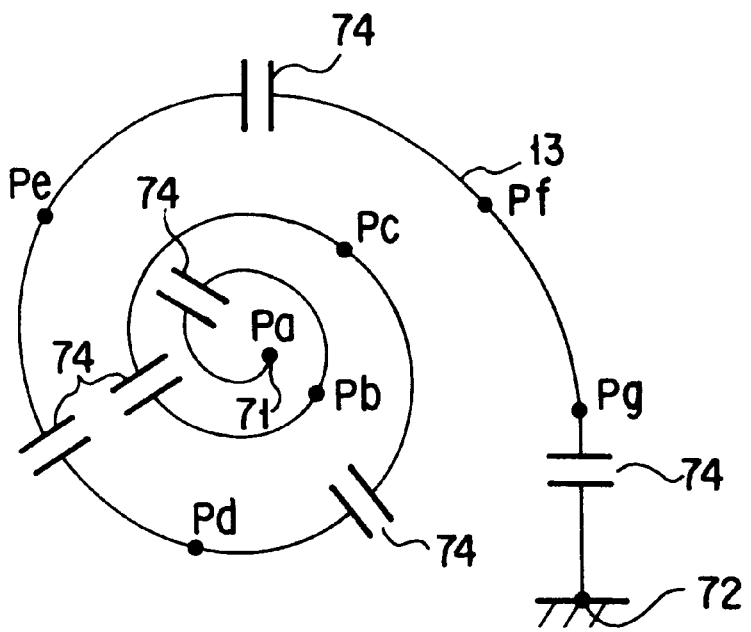
FIG. 27 is a view showing another modification to the RF antenna.

FIG. 27 is a view illustrating another modification of the RF antenna 13. This modification also counters the same problem that is handled by the modification shown in FIG. 24 and thus can be applied to all the embodiments described above. As shown in FIG. 27, a spiral plane coil antenna section of the antenna includes a power supply point 71 connected to an RF power supply 15 (see FIG. 1, for example) at the center thereof and a ground point 72, which is grounded through the main vessel 1, at one end thereof. Between these points 71 and 72, the antenna 13 is divided into a plurality of (five) antenna segments and the five segments and six capacitors 74 are arranged alternately and connected to each other.

Since, therefore, the plural capacitors 74 are arranged in series with the antenna 13, the impedance of the entire antenna can be reduced further and so can be the potential of the antenna, and the current can be prevented from reducing.

Figure 28:
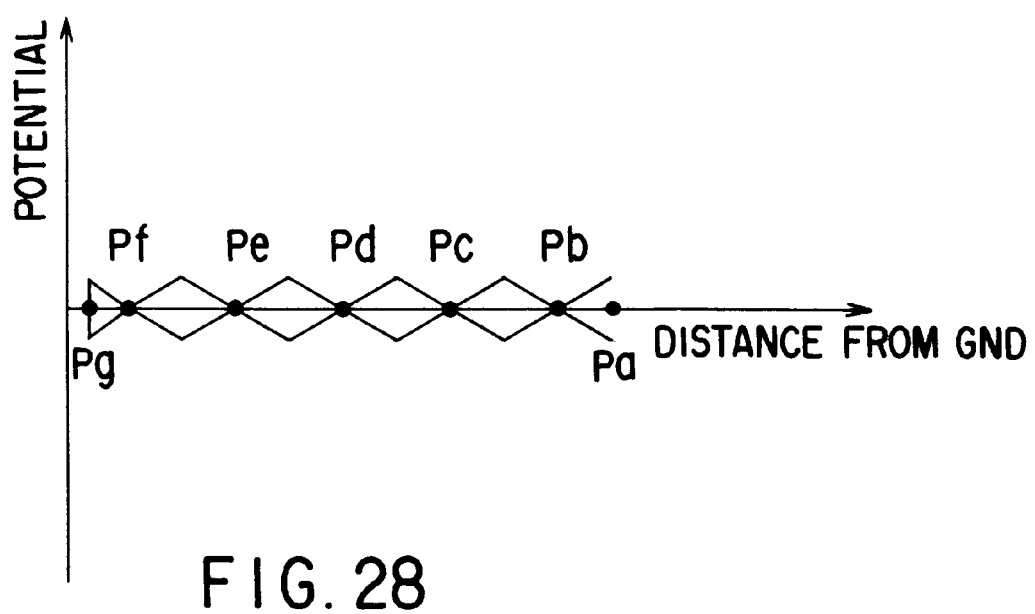
FIG. 28 is a graph showing a relationship between the distance from a ground and the potential in the antenna illustrated in FIG. 27.

FIG. 28 is a diagram showing a relationship between the distance from the ground point and the potential of the antenna 13 shown in FIG. 27. Assuming, as shown in FIG. 28, that the power supply point 71 of the center of the antenna is Pa, the midpoints of the antenna segments are Pb, Pc, Pd, Pe and Pf, and the ground-side terminal of the antenna 13 is Pg, the antenna potentials at Pb to Pf become zero, and the potential between the respective points is lowered further.

Even though the antenna 13 is lengthened as the processing apparatus increases in size, the potential from the power supply point 71 (Pa) and the ground point 72 is lowered and the non-uniformity of electric fields between the central part and the periphery of the antenna 13 can be reduced. It is thus possible to generate induction plasma uniformly and at high densities.

In the foregoing embodiments, the present invention has been described using an etching apparatus as an example. The present invention can be applied to another inductively-coupled-plasma-processing apparatus, such as a deposition apparatus and an ashing apparatus. It also can be applied to an apparatus for processing not an LCD glass substrate but a semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An inductively-coupled-plasma-processing apparatus for processing a target substrate, comprising:
    an airtight process chamber;
    a worktable on which the target substrate is placed in the process chamber;
    a process gas supply system for supplying a process gas into the process chamber;
    an exhaust system for exhausting the process chamber and setting the process chamber at a vacuum;
    a dielectric panel arranged in a ceiling of the process chamber;
    an RF antenna arranged outside the process chamber to face the dielectric panel, the RF antenna generating an inductive electric field for turning the process gas into plasma in the process chamber;
    an overhead frame arranged above the dielectric panel;
    a suspender supported by the overhead frame and arranged to impose a load of the dielectric panel on the overhead frame such that the dielectric panel is prevented from warping downward, the suspender being disposed at a position distant from a peripheral edge of the dielectric panel and within a contour of the target substrate mounted on the worktable; and
    a showerhead arranged between the worktable and the dielectric panel and including a shower case having a gas flow path connected to the process gas supply system and a plurality of gas supply holes opened to the worktable, the shower case being connected to the suspender and having a portion extending in parallel to the dielectric panel to serve as a supporting bracket for supporting the dielectric panel.

2. The apparatus according to claim 1, further comprising an antenna chamber arranged above the process chamber, for receiving the RF antenna, a ceiling of the antenna chamber serving as the overhead frame.

3. The apparatus according to claim 2, wherein the dielectric panel partitions an airtight main vessel into the antenna chamber and the process chamber on upper and lower sides, respectively.

4. The apparatus according to claim 1, wherein the shower case is substantially made of metal.

5. The apparatus according to claim 4, wherein the shower case has a shape that extends in a direction substantially perpendicular to a direction in which the RF antenna extends.

6. The apparatus according to claim 4, wherein the shower case is grounded.

7. The apparatus according to claim 1, wherein the suspender is hollow and accommodates a gas tube for supplying the process gas from the process gas supply system to the gas supply holes.

8. The apparatus according to claim 1, wherein the dielectric panel has a recess in a bottom surface thereof, for receiving the shower case.

9. The apparatus according to claim 8, further comprising a dielectric cover for covering the bottom surface of the dielectric panel and that of the shower case, the dielectric cover including holes corresponding to the gas supply holes.

10. The apparatus according to claim 1, wherein the dielectric panel comprises a plurality of segments adjacent to each other on the shower case.

11. An inductively-coupled-plasma-processing apparatus for processing a target substrate, comprising:
    an airtight process chamber;
    a worktable on which the target substrate is placed in the process chamber;
    a process gas supply system for supplying a process gas into the process chamber;
    an exhaust system for exhausting the process chamber and setting the process chamber at a vacuum;
    a dielectric panel arranged in a ceiling of the process chamber;
    an RF antenna arranged outside the process chamber to face the dielectric panel, the RF antenna generating an inductive electric field for turning the process gas into plasma in the process chamber;
    an overhead frame arranged above the dielectric panel;
    a suspender supported by the overhead frame and arranged to impose a load of the dielectric panel on the overhead frame such that the dielectric panel is prevented from warping downward, the suspender being disposed at a position distant from a peripheral edge of the dielectric panel and within a contour of the target substrate mounted on the worktable.

12. The apparatus according to claim 11, wherein the supporting bracket has a shape that extends in a direction substantially perpendicular to a direction in which the RF antenna extends.

13. The apparatus according to claim 11, wherein the supporting bracket is grounded.

14. The apparatus according to claim 11, wherein the dielectric panel has a recess in a bottom surface thereof, for receiving the supporting bracket.

15. The apparatus according to claim 14, further comprising a dielectric cover for covering the bottom surface of the dielectric panel and that of the supporting bracket.

16. The apparatus according to claim 11, wherein the dielectric panel comprises a plurality of segments adjacent to each other on the supporting bracket.

17. The apparatus according to claim 11, further comprising a heater arranged on the suspender, for heating the dielectric panel.

18. An inductively-coupled-plasma-processing apparatus for processing a target substrate, comprising:
   an airtight main vessel;
   a dielectric panel for partitioning the main vessel into an upper antenna chamber and a lower process chamber;
   a worktable on which the target substrate is placed in the process chamber;
   a process gas supply system for supplying a process gas into the process chamber;
   an exhaust system for exhausting the process chamber and setting the process chamber at a vacuum;
   an RF antenna arranged in the antenna chamber to face the dielectric panel, the RF antenna generating an inductive electric field for turning the process gas into plasma in the process chamber;
   a suspender supported by a ceiling of the main vessel and arranged to impose a load of the dielectric panel on a ceiling of the main vessel such that the dielectric panel is substantially prevented from warping downward, the suspender being disposed at a position distant from a peripheral edge of the dielectric panel and within a contour of the target substrate mounted on the worktable; and
   a supporting bracket connected to the suspender and arranged to support the dielectric panel.

19. The apparatus according to claim 18, wherein the supporting member has a portion extending in parallel to the dielectric panel, and the dielectric panel is placed on the supporting member.

20. The apparatus according to claim 19, wherein the dielectric panel comprises a plurality of segments adjacent to each other on the supporting member.

21. An inductively-coupled-plasma-processing apparatus for processing a target substrate, comprising:
   an airtight process chamber;
   a worktable on which the target substrate is placed in the process chamber;
   a process gas supply system for supplying a process gas into the process chamber;
   an exhaust system for exhausting the process chamber and setting the process chamber at a vacuum;
   a dielectric panel arranged in a ceiling of the process chamber;
   an RF antenna arranged outside the process chamber to face the dielectric panel, the RF antenna generating an inductive electric field for turning the process gas into plasma in the process chamber;
   a supporting bracket having a portion extending in parallel to the dielectric panel and arranged to support the dielectric panel, the dielectric panel being place don the supporting bracket; and
   a dielectric cover for covering a bottom surface of the dielectric panel and that of the supporting bracket the dielectric cover having a flat bottom surface.

22. The apparatus according to claim 21, wherein the dielectric panel has a recess in the bottom surface thereof, for receiving the supporting bracket.

23. The apparatus according to claim 21, further comprising a showerhead arranged between the worktable and the dielectric panel and including a shower case having a gas flow path connected to the process gas supply system and a plurality of gas supply holes opened to the worktable, the shower case serving as the supporting bracket, and the dielectric cover having holes corresponding to the gas supply holes.

24. The apparatus according to claim 21, further comprising an overhead frame arranged above the dielectric panel; and
   a suspender arranged at a distance from a peripheral edge of the dielectric panel so as to impose a load of the dielectric panel on the overhead frame.

25. An inductively-coupled-plasma-processing apparatus for processing a target substrate, comprising:
   an airtight process chamber;
   a worktable on which the target substrate is placed in the process chamber;
   a process gas supply system for supplying a process gas into the process chamber;
   an exhaust system for exhausting the process chamber and setting the process chamber at a vacuum;
   a dielectric panel arranged in a ceiling of the process chamber;
   an RF antenna arranged outside the process chamber to face the dielectric panel, the RF antenna generating an inductive electric field for turning the process gas into plasma in the process chamber;
   a showerhead arranged between the worktable and the dielectric panel and including a substantially metal shower case having a gas flow path connected to the process gas supply system and a plurality of gas supply holes opened to the worktable
   wherein the shower case has a shape that extends in a direction substantially perpendicular to a direction in which the RF antenna extends.

26. The apparatus according to claim 25, wherein the RF antenna is divided into a plurality of antenna segments, and a capacitor is connected in series between the antenna segments to lower an antenna impedance.

27. The apparatus according to claim 25, wherein the RF antenna includes a spiral antenna and the shower case has a shape that extends in a radial direction.

28. The apparatus according to claim 25, wherein the RF antenna includes an antenna having a plurality of long straight portions extending in parallel to each other, and the shower case includes a plurality of portions extending perpendicularly to the straight portions and parallel to each other.

29. The apparatus according to claim 25, wherein the shower case is grounded.

30. The apparatus according to claim 25, further comprising a dielectric cover for covering a bottom surface of the shower case, the dielectric cover including holes corresponding to the gas supply holes.

31. The apparatus according to claim 25, further comprising one capacitor connected in series with the RF antenna and having an impedance whose absolute value is about half that of the RF antenna, the capacitor lowering an antenna impedance.

32. The apparatus according to claim 1, wherein the dielectric panel is placed on the supporting bracket.

33. The apparatus according to claim 11, wherein the dielectric panel is placed on the supporting bracket.

* * * * *